United States Patent
Pola et al.

(10) Patent No.: US 10,347,590 B2
(45) Date of Patent: Jul. 9, 2019

(54) LEADFRAME FOR A SEMICONDUCTOR COMPONENT

(71) Applicant: Conti Temic microelectronic GmbH, Nuremberg (DE)

(72) Inventors: Olivier Pola, Toulouse (FR); Michael Walk, Pilsach (DE)

(73) Assignee: CONTI TEMIC MICROELECTRONIC GMBH, Nuremberg (DE)

(*) Notice: Subject to any disclaimer, the term of this patent is extended or adjusted under 35 U.S.C. 154(b) by 0 days.

(21) Appl. No.: 15/523,460

(22) PCT Filed: Sep. 16, 2015

(86) PCT No.: PCT/EP2015/071221
§ 371 (c)(1),
(2) Date: May 1, 2017

(87) PCT Pub. No.: WO2016/066320
PCT Pub. Date: May 6, 2016

(65) Prior Publication Data
US 2017/0309580 A1    Oct. 26, 2017

(30) Foreign Application Priority Data
Oct. 31, 2014    (DE) .................. 10 2014 222 334

(51) Int. Cl.
*H01L 23/00*    (2006.01)
*H01L 23/495*    (2006.01)

(52) U.S. Cl.
CPC ........ *H01L 23/562* (2013.01); *H01L 23/4952* (2013.01); *H01L 23/49503* (2013.01);
(Continued)

(58) Field of Classification Search
None
See application file for complete search history.

(56) References Cited

U.S. PATENT DOCUMENTS 8,541,305 B2 *  9/2013  Zhu .................. H01L 21/76898
                                                257/751
2002/0190374 A1  12/2002  Nakajima et al. ............ 257/707
(Continued)

FOREIGN PATENT DOCUMENTS

| CN | 103871987 A | 6/2014 | ............ G91K 23/48 |
| GB | 1058541 A | 2/1967 | ............ H01C 1/024 |
| JP | 5484477 A | 7/1979 | ............ H01L 21/52 |
| JP | 55150246 A | 11/1980 | ............ H01L 21/52 |

(Continued)

OTHER PUBLICATIONS

German Office Action, Application No. 102014222334.2, 6 pages, dated Feb. 18, 2015.
International Search Report and Written Opinion, Application No. PCT/EP2015/071221, 22 pages, dated Jan. 4, 2016.
Chinese Office Action, Application No. 201580059291.4, 21 pages, dated Oct. 12, 2018.

*Primary Examiner* — Telly D Green
(74) *Attorney, Agent, or Firm* — Slayden Grubert Beard PLLC

(57) ABSTRACT

The present disclosure relates to semiconductor components. The teachings thereof may be embodied in a lead frame for a semiconductor component including: a frame having a recess; an electrically conductive connecting element for establishing an electrical connection to the semiconductor component arranged in the recess; and an insulating element arranged in the recess and mechanically connecting the connecting element to the frame and electrically insulating it from the frame.

14 Claims, 1 Drawing Sheet

(52) U.S. Cl.
CPC .. *H01L 23/49524* (2013.01); *H01L 23/49537* (2013.01); *H01L 23/49558* (2013.01); *H01L 23/49562* (2013.01); *H01L 23/49568* (2013.01); *H01L 23/49575* (2013.01); *H01L 24/37* (2013.01); *H01L 24/40* (2013.01); *H01L 24/41* (2013.01); *H01L 2224/0603* (2013.01); *H01L 2224/37124* (2013.01); *H01L 2224/37147* (2013.01); *H01L 2224/40095* (2013.01); *H01L 2224/40139* (2013.01); *H01L 2224/40245* (2013.01); *H01L 2224/41113* (2013.01); *H01L 2224/48091* (2013.01); *H01L 2224/48472* (2013.01); *H01L 2224/49113* (2013.01); *H01L 2224/83801* (2013.01); *H01L 2224/84801* (2013.01)

(56) References Cited

U.S. PATENT DOCUMENTS

| | | | |
|---|---|---|---|
| 2010/0072506 A1 | 3/2010 | Bae et al. | 257/99 |
| 2011/0284992 A1* | 11/2011 | Zhu | H01L 21/76898 257/611 |
| 2014/0167237 A1 | 6/2014 | Yoo et al. | 257/676 |

FOREIGN PATENT DOCUMENTS

| | | | | |
|---|---|---|---|---|
| JP | 2003046058 A | 2/2003 | | H01L 25/07 |
| WO | 2016/066320 A1 | 5/2016 | | H01L 23/492 |

* cited by examiner

LEADFRAME FOR A SEMICONDUCTOR COMPONENT

CROSS-REFERENCE TO RELATED APPLICATIONS

This application is a U.S. National Stage application of International Application No. PCT/EP2015/071221 filed Sep. 16, 2015, which designates the United States of America, and claims priority to DE Application No. 10 2014 222 334.2 filed Oct. 31, 2014, the contents of which are hereby incorporated by reference in their entirety.

TECHNICAL FIELD

The present disclosure relates to semiconductor components. The teachings thereof may be embodied in a lead frame for at least one semiconductor component and/or to a circuit arrangement comprising at least one lead frame.

BACKGROUND

Circuit arrangements with lead frames which are composed, in some cases, of punched pieces of sheet metal and serve as solderable metallic circuit carriers for mechanically attaching semiconductor components, in particular naked chips (semiconductor chips without a housing), and for establishing electrical connections to these semiconductor components. The semiconductor components are soldered directly onto the lead frame and directly electrically connected to the lead frame via the soldered connections. Electrical connections of these semiconductor components to the electrical components of the circuit arrangements outside the lead frames are generally established by means of bonded connections (chip bonds). Owing to the susceptibility to shocks and ageing of materials, the bonded connections are one of the main causes for the failures of the circuit arrangements. Furthermore, control connections of circuit arrangements take up additional installation space and may make the circuit arrangements more complex.

SUMMARY

The teachings of the present disclosure may enable circuit arrangements better, in particular, with respect to the reliability, the overall size and the construction costs.

For example, a lead frame (AR, AR2) for a semiconductor component (HB) may include: a recess (AS, AS2); an electrically conductive connecting element (PF) for establishing an electrical connection to the semiconductor component (HB, HB2) which is arranged in the recess (AS, AS2); and an insulating element (IS, IS1) which is arranged in the recess (AS, AS2) and mechanically connects the connecting element (PF) to the lead frame (AR, AR2) and electrically insulates it from the lead frame (AR, AR2).

In some embodiments, the insulating element (IS) has an essentially cylindrical cavity (HR1) in which an insertion element (EE), which connects the insulating element (IS) and the connecting element (PF) to one another mechanically, is arranged.

In some embodiments, the insertion element (EE) is embodied in an electrically conductive fashion.

In some embodiments, the insulating element (IS) comprises a base region (BB) which closes off the cavity (HR1) on one side and electrically insulates the connecting element (PF) from the lead frame (AR).

In some embodiments, the insertion element (EE) encapsulates an essentially cylindrical cavity (HR2) in which the connecting element (PF) is arranged, and is electrically and mechanically connected to the insertion element (EE).

In some embodiments, the connecting element (PF) is connected to the insertion element (EE) in a positively and/or frictionally locking fashion.

In some embodiments, the insertion element (EE) comprises a molded-on element (AF) which extends away from the cylindrical cavity (HR2) and has an electrically conductive contact face (KF) for establishing a bonded connection (BV) of the insertion element (EE) to the semiconductor component (HB).

As another example, a circuit arrangement (SA, SA1) may comprise at least one semiconductor component (HB, HB2) and at least one lead frame (AR, AR2) as described above, wherein the at least one semiconductor component (HB, HB2) is arranged on a surface (OF, OF2) of the at least one lead frame (AR, AR2) and is electrically connected to the connecting element (PF) of the at least one lead frame (AR, AR2) via a bonded connection (BD, BD2).

Some embodiments may include: two lead frames (AR1, AR2) for in each case at least one semiconductor component (HB1, HB2), wherein the two lead frames (AR1, AR2) each have a recess (AS1, AS2); an electrically conductive connecting element (PF) for establishing an electrical connection to at least one of the at least two semiconductor components (HB1, HB2) which is arranged in one of the two recesses (AS1, AS2); and an insulating element (IS1) which is arranged in the two recesses (AS1, AS2) and electrically insulates the connecting element (PF) from the two lead frames (AR1, AR2).

Some embodiments also comprise an insertion element (EE1) which is arranged in the two recesses (AS1, AS2) and connects the two lead frames (AR1, AR2) to one another mechanically.

BRIEF DESCRIPTION OF THE DRAWINGS

In the text which follows, an example embodiment will be explained in more detail below with reference to the accompanying drawings, in which.

DETAILED DESCRIPTION

Figure 1:
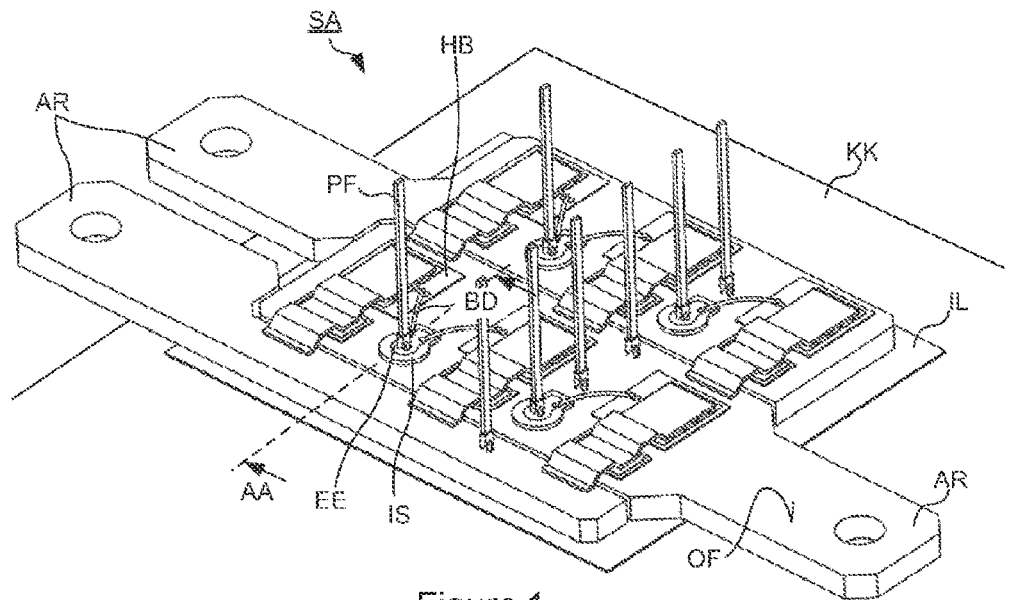
FIG. 1 shows a schematic birds-eye-view illustration of a section of a circuit arrangement according to an embodiment of the teachings of the present disclosure.

In some embodiments, a lead frame for a semiconductor component comprises a recess which is either continuously or not continuously shaped. The lead frame also comprises an electrically conductive connecting element for establishing an electrical connection to the semiconductor component. The connecting element is arranged here (at least partially) in the recess. The lead frame also comprises an insulating element which is arranged in the recess and mechanically connects the connecting element to the lead frame and at the same time electrically insulates it from the lead frame. In this context, the lead frame is electrically conductive and may be composed of a metal or a metal alloy, e.g., copper, a copper alloy, or aluminum alloy.

The bonded connections which electrically connect the semiconductor components arranged on typical lead frames to circuit components of the circuit arrangements are located outside the lead frame and therefore span wide distances, and are, therefore, subjected to strong mechanical stresses owing to the shocks experienced by the circuit arrangement and the mechanical vibrations connected therewith between the lead frame and the external circuit components. These mechanical stresses cause the bonded connections to age rapidly and therefore fracture or become detached from the contact points. In addition, such bonded connections and corresponding connections for establishing electrical connections of the bonded connections to the external circuit components take up a considerable installation space which in turn has an adverse effect on the overall size of the circuit arrangement.

The teachings of the present disclosure provide the lead frame described above, wherein the electrical connections of the lead frame or the semiconductor components arranged on the lead frame are established via the electrically conductive connecting elements which are mechanically significantly more stable than the abovementioned bonded connections and in addition are significantly more compact than the abovementioned connections for establishing electrical connections of the bonded connections to the external circuit components, which are as a rule welded to the edge of the lead frames.

In some embodiments, the connecting elements comprise a press-fit pin. The electrical connections of the lead frame or of the semiconductor components to the circuit components located outside the lead frame can be established via these more stable connecting elements. The direct electrical connections of the semiconductor components to the connecting elements arranged on the same lead frame can also be established by the bonded connections which span short distances and are therefore significantly more stable and resistant to vibrations. In addition, these bonded connections are not subject to the mechanical stresses which are caused by the mechanical vibrations between the lead frame and the external circuit components. The circuit arrangements may therefore be more stable and more reliable.

The connecting elements (or press-fit pins) may be positioned in a flexible way on all of the lead frame wherever free insulation spaces, e.g., intermediate spaces between two circuit components on the lead frame are available. As a result, the insulation spaces which are present can be utilized more effectively and the overall size of the circuit arrangements can be reduced. In addition, the complexity of the lead frames can be reduced thanks to the flexibility mentioned above. Since the connecting elements can additionally be dimensioned relatively freely, they can also be embodied with low inductance. Therefore, a circuit arrangement which is better with respect to the reliability, the overall size, and/or the construction costs may result.

The insulating element may include an essentially cylindrical cavity in which an insertion element, which connects the insulating element and the connecting element to one another mechanically, is arranged. The insertion element may be electrically conductive in order to connect the semiconductor component electrically to the connecting element. The insulating element also comprises a base region which closes off the cavity on one side and electrically insulates the connecting element from the lead frame.

The base region may comprise a plastic and serves to protect the lead frame against mechanical damage by the connecting element as well as to maintain a minimum creeping current distance between the current-connecting element and the electrically conductive and current-conducting lead frame.

The insertion element may encapsulate an essentially cylindrical cavity in which the connecting element is at least partially arranged, and is electrically conductive and mechanically connected to the insertion element. In some embodiments, the connecting element is connected to the insertion element in a positively and/or frictionally locking fashion.

The insertion element may comprise a section in the form of a cylindrical casing which encapsulates the cylindrical cavity, and an adjoining molded-on element which points in the radial direction and has an electrically conductive contact face which serves to make electrical contact with a bonded connection of the insertion element to the semiconductor component.

Some embodiments comprise a circuit arrangement with at least one semiconductor component and at least one lead frame as described above, wherein the at least one semiconductor component is arranged on the surface of the at least one lead frame and is electrically connected to the connecting element of the at least one lead frame via a bonded connection. The circuit arrangement may comprise at least two lead frames each supporting at least one semiconductor component and establishing electrical connection to this at least one semiconductor component. In this context, the two lead frames may be electrically conductive and may be composed of a metal or a metal alloy e.g., copper, a copper alloy, or an aluminum alloy.

In some embodiments, the two lead frames each have a recess. The two recesses may extend essentially in a slit shape as far as an edge of the respective lead frames.

In some embodiments, the circuit arrangement comprises an electrically conductive connecting element for establishing an electrical connection to the at least two semiconductor components arranged in a distributed fashion on the surfaces of the respective lead frames. The connecting element may comprise essentially a rod arranged in one of the two recesses.

In some embodiments, the circuit arrangement also comprises an electrically insulating element arranged in the two recesses of the at least two lead frames and extending from one of the two recesses to the other of the two recesses. The insulating element electrically insulates the connecting element from the at least two lead frames and at the same time may connect the connecting element and the at least two lead frames physically or mechanically to one another.

FIG. 1 shows a section of a circuit arrangement SA of an inverter for making available phase currents for an electric motor (not illustrated in the figure) in an oblique birds-eye view illustration, in an example embodiment of the teachings of the present disclosure. The circuit arrangement SA comprises three lead frames AR arranged one next the other on a heat sink KK and electrically insulated from the heat sink KK by means of an insulation layer IL.

The lead frames AR may each be punched out of a piece of sheet metal and are therefore electrically conductive. Three semiconductor switches HB are arranged on respective surfaces OF, facing away from the heat sink KK, of two of the three lead frames AR and are each connected in an electrically conductive and mechanical fashion to the respective lead frames AR via a soldering surface.

In some embodiments, the semiconductor switches HB may comprise MOSFETs (metal oxide semiconductor field effect transistors, naked chips) without housings and surface-contacted via the respective source connections on the surfaces OF of the respective lead frames AR and are electrically connected to the respective lead frames AR.

In addition, press-fit pins PF (connecting elements) may be arranged on the same surfaces OF of the same two lead frames AR, which press-fit pins PF are each pressed into a recess AS, provided for that purpose, on the surface OF of the respective lead frames AR. The press-fit pins PF may comprise metallic pins, for example from a metal wire such as a copper wire.

Figure 2:
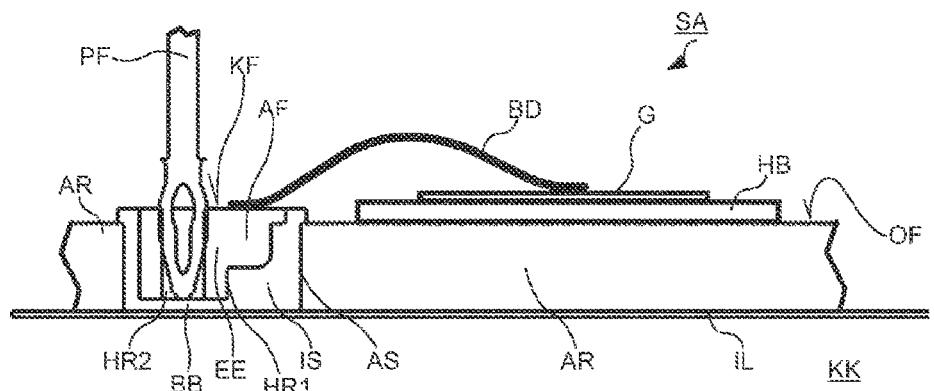
FIG. 2 shows a schematic illustration of a lateral section of the circuit arrangement illustrated in FIG. 1, along a sectional line AA.

An example section of the recess AS together with the press-fit pins PF arranged therein is illustrated in detail in FIG. 2. In this context, FIG. 2 shows a lateral cross section of one of the lead frames AR along the cross-sectional line AA in FIG. 1. As can be clearly seen in FIG. 2, the lead frame AR may include, on the surface OF, a continuous cylindrical recess AS in which an insulating element IS is arranged and attached in a mechanical (frictionally locking) fashion.

In some embodiments, the insulating element IS comprises an electrically insulating material, e.g., plastic, and comprises a hollow cylinder with an essentially cylindrical cavity HR1. The insulating element IS may have a base region BB which closes off the cavity HR1 on one side and spatially separates it from the insulating layer IL lying under the lead frame AR. An insertion element EE made of a metal or a metal alloy, e.g., an aluminum alloy is arranged in the cavity HR1 of the insulating element IS and connected in a mechanical (frictionally locking) fashion, for example by pressing in, joining, or encapsulation by injection molding into the cavity HR1, to the insulating element IS or the lead frame AR. The insertion element EE may comprise an electrically conductive material, e.g., copper or a copper alloy, and has a shape which is matched to the shape of the cavity HR1 of the insulating element IS.

The insertion element EE may comprise an essentially hollow-cylindrical round body which encloses a cylindrical cavity HR2 in the form of a casing. The insertion element EE may also comprise a molded-on element AF which extends radially away from the cavity HR2 of the insertion element EE and is molded onto the round body of the insertion element EE. The molded-on element AF has a contact face KF onto which a bonding wire BD is soldered and therefore placed in electrical contact with the insertion element EE. The bonding wire BD is also soldered onto a contact face of the semiconductor switch HB, located on the surface OF of the lead frame AR, and therefore electrically connects the semiconductor switch HB to the insulation element EE.

The press-fit pin PF is pressed into the cavity HR2 of the insertion element EE, wherein during the pressing into the cavity HR2 the latter has deformed and is therefore connected in a positively locking or frictionally locking stable fashion to the insertion element EE (press fit connection).

The bonding wire BD therefore extends from the semiconductor switch HB to the insertion element EE and electrically connects the gate connection of the semiconductor switch HB to the insertion element EE or the press-fit pin PF.

In some embodiments, both the semiconductor switch HB and the insertion element EE are arranged on the same surface OF of the same lead frame AR and therefore arranged fixedly in terms of movement and free of vibration with respect to one another. As a result, the bonding wire BD is protected against mechanical stresses which are caused by mechanical vibrations between the lead frame and the external circuit components. Consequently, the bonding wire BD ages more slowly than a bonding wire of a bonded connection mentioned at the beginning.

In addition, the recess AS together with the press-fit pin PF can be positioned in a flexible fashion at a location of the lead frame AR where it is most suitable in terms of circuit technology, and takes up the least installation space of the circuit arrangement SA. As a result, the circuit arrangement SA can be constructed economically in terms of installation space and with a low level of complexity.

The press-fit connection of the press-fit pin PF with the lead frame AR can be established more easily and cost-effectively compared to an ultrasound welded connection.

Figure 3:
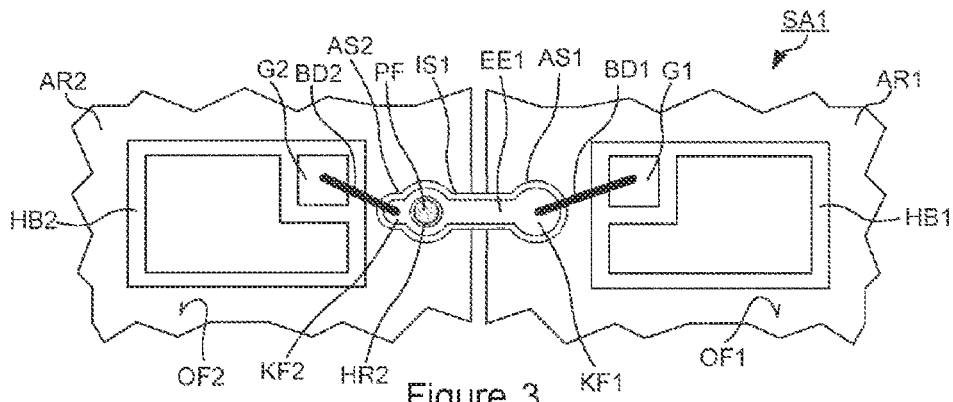
FIG. 3 shows a schematic plan view of a section of a circuit arrangement according to a further embodiment of the teachings of the present disclosure.

FIG. 3 shows a schematic plan view of a section of an example circuit arrangement SA1 with a first lead frame AR1 and a second lead frame AR2 which are arranged one next the other. The two lead frames AR1, AR2 may each comprise a punched piece of sheet metal and be therefore electrically conductive.

On respective surfaces OF1, OF2 of the respective same sides facing the viewer of the figure, the two lead frames AR1, AR2 each have a recess AS1, AS2, which recesses AS1, AS2 each extend in a slit shape as far as an edge of the respective lead frames AR1, AR2 and extend in directions which respectively face one another.

In some embodiments, the circuit arrangement SA1 may comprise an insertion element EE1 comprising an electrically conductive metal alloy essentially in the form of a dumbbell. The insertion element EE1 may be arranged in the two recesses AS1, AS2 and extend from one of the two recesses AS1 to the other recess AS2. As a result, the insertion element EE1 connects the two lead frames AR1, AR2 to one another physically and mechanically. The insertion element EE1 engages in the two recesses AS1, AS2 in a positively locking fashion. The two recesses AS1, AS2 have undercuts, into which, for example, the insertion element EE1 engages in a positively locking fashion.

In some embodiments, the insertion element EE1 is mechanically connected to the two lead frames AR1, AR2 by means of an insulating element IS1 which is arranged between the insertion element EE1 and the inner wall of the two recesses AS1, AS2, and physically and mechanically connects the insertion element EE1 to the two lead frames AR1, AR2 and at the same time electrically insulates it from the two lead frames AR1, AR2. The insertion element EE1 may have at each of its two ends a planar contact face KF1, KF2, to establish electrical connections.

In some embodiments, at an end region, the insertion element EE1 additionally has an essentially cylindrical recess which forms a cavity HR2 for receiving and for mechanically attaching (press-fit connection) a press-fit pin.

In some embodiments, the circuit arrangement SA1 comprises a press-fit pin PF composed of a copper wire pressed into the cavity HR2 of the insulation element EE1 in a press-fit process. The press-fit pin PF serves to establish electrical connection of the insertion element EE1 to external circuit components.

In some embodiments, the circuit arrangement SA1 comprises two MOSFETs HB1, HB2 (naked chips) without housings and each arranged on the respective surfaces OF1, OF2 of the two lead frames AR1, AR2 and surface-contacted to the respective lead frames AR1, AR2 via the respective source connection (not shown in the figure) by means of a soldered connection. The two MOSFETs HB1, HB2 may also be electrically connected to the insertion element EE1 and therefore to the press-fit pin PF via the respective gate connection G1, G2 and by means of a bonded connection BD1, BD2 in each case. In this context, the two bonded connections BD1, BD2 extend between the respective gate connections and respective corresponding contact faces KF1, KF2 of the insertion element EE1.

What is claimed is:

1. A lead frame for a semiconductor component, the lead frame comprising:
    a frame having a recess;
    an insulating element arranged in the recess, the insulating element including a cavity;
    an electrically conductive insertion element arranged in the cavity of the insulating element and insulated from the lead frame by the insulating element, the electrically conductive insertion element having a cavity;
    an electrically conductive connecting element arranged in and extending longitudinally out from the cavity of the electrically conductive insertion element; and
    a wire bond attached to a surface of the electrically conductive insertion element and to the semiconductor component.

2. The lead frame as claimed in claim 1, wherein the cavity in the insulating element in which the electrically conductive insertion element is arranged comprises an essentially cylindrical cavity.

3. The lead frame as claimed in claim 1, wherein the cavity in the insulating element in which the electrically conductive insertion element is arranged comprises a non-cylindrical cavity.

4. The lead frame as claimed in claim 1, wherein the insulating element comprises a base region bounding the cavity on one side and electrically insulating the electrically conductive insertion element and the electrically conductive connecting element from the frame.

5. The as claimed in claim 2, wherein the electrically conductive connecting element is electrically and mechanically connected to the insertion element.

6. The lead frame as claimed in claim 1, further comprising the electrically conductive connecting element connected to the electrically conductive insertion element in a positively or frictionally locking fashion.

7. The lead frame as claimed in claim 1, wherein the electrically conductive insertion element comprises a molded on element.

8. A circuit arrangement comprising:
    a semiconductor component mounted on a lead frame; and
    the lead frame comprising:
    a frame having a recess;
    an insulating element arranged in the recess, the insulating element including a cavity; and
    an electrically conductive insertion element arranged in the cavity of the insulating element and insulated from the lead frame by the insulating element, the electrically conductive insertion element having a cavity;
    an electrically conductive connecting element arranged in and extending longitudinally out from the cavity in the electrically conductive insertion element;
    wherein the semiconductor component is electrically connected to the electrically conductive insertion element via a wire-bonded connection attached to a surface of the electrically conductive insertion element.

9. The circuit arrangement as claimed in claim 8, further comprising:
    a second lead frame for at least one further semiconductor component, the second lead frame having a frame with a recess;
    the electrically conductive insertion element establishing an electrical connection to at least one of the at least two semiconductor components arranged in a respective one of the two recesses; and
    the insulating element being arranged in the two recesses and electrically insulating the electrically conductive insertion element from the two lead frames.

10. The circuit arrangement as claimed in claim 9, wherein the insertion element is inserted into both of the two recesses and connects the two lead frames to one another mechanically.

11. The lead frame as claimed in claim 1, wherein the wire bond is directly attached to a planar surface of the electrically conductive insertion element.

12. The lead frame as claimed in claim 1, wherein the wire bond is directly attached to the electrically conductive insertion element, but not directly attached to the electrically conductive connecting element.

13. The circuit arrangement as claimed in claim 9, wherein the semiconductor component is electrically connected to a planar surface of the electrically conductive insertion element via the wire-bonded connection.

14. The circuit arrangement as claimed in claim 9, wherein the wire-bonded connection is directly attached to the electrically conductive insertion element, but not directly attached to the electrically conductive connecting element.

* * * * *